US011955380B2

(12) United States Patent
Tsai et al.

(10) Patent No.: US 11,955,380 B2
(45) Date of Patent: *Apr. 9, 2024

(54) CONDUCTIVE ELEMENT FOR SEMICONDUCTOR DEVICES

(71) Applicant: Taiwan Semiconductor Manufacturing Co., Ltd., Hsinchu (TW)

(72) Inventors: Kuo-Chiang Tsai, Hsinchu (TW); Jyh-Huei Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/057,158

(22) Filed: Nov. 18, 2022

(65) Prior Publication Data

US 2023/0085350 A1 Mar. 16, 2023

Related U.S. Application Data

(63) Continuation of application No. 17/201,637, filed on Mar. 15, 2021, now Pat. No. 11,508,616, which is a (Continued)

(51) Int. Cl.
| H01L 21/00 | (2006.01) |
| H01L 21/311 | (2006.01) |
| H01L 21/3213 | (2006.01) |
| H01L 21/768 | (2006.01) |
| H01L 23/522 | (2006.01) |

(Continued)

(52) U.S. Cl.
CPC .. H01L 21/76877 (2013.01); H01L 21/31111 (2013.01); H01L 21/31116 (2013.01); H01L 21/32133 (2013.01); H01L 23/5226 (2013.01); H01L 21/0274 (2013.01);
(Continued)

(58) Field of Classification Search
CPC ......... H01L 21/76877; H01L 21/31111; H01L 23/5226; H01L 21/32133; H01L 21/31116; H01L 21/7684; H01L 21/0274; H01L 21/3212; H01L 21/76802
See application file for complete search history.

(56) References Cited

U.S. PATENT DOCUMENTS 6,620,732 B1 * 9/2003 Schuegraf ......... H01L 29/66242
 438/320
7,045,896 B2 * 5/2006 Ahn ................... H01L 23/53238
 257/E23.152

(Continued)

FOREIGN PATENT DOCUMENTS

TW 492149 B 6/2002

Primary Examiner — Nicholas J Tobergte
(74) Attorney, Agent, or Firm — Haynes and Boone, LLP (57) ABSTRACT

In one example, a semiconductor device includes a first conductive feature embedded in a first dielectric layer such that a top surface of the first dielectric layer is higher than a top surface of first conductive feature, a contact etch stop layer (CESL) disposed on the first dielectric layer, and a second conductive feature embedded in a second dielectric layer. The second dielectric layer is disposed on the CESL and the second conductive feature extends through the CESL and is in direct contact with the first conductive feature.

20 Claims, 7 Drawing Sheets

Related U.S. Application Data continuation of application No. 16/371,780, filed on Apr. 1, 2019, now Pat. No. 10,950,497.

(60) Provisional application No. 62/771,401, filed on Nov. 26, 2018.

(51) Int. Cl.
*H01L 21/027* (2006.01)
*H01L 21/321* (2006.01)

(52) U.S. Cl.
CPC .... *H01L 21/3212* (2013.01); *H01L 21/76802* (2013.01); *H01L 21/7684* (2013.01)

(56) References Cited

U.S. PATENT DOCUMENTS

| | | | | |
|---|---|---|---|---|
| 7,071,517 B2* | 7/2006 | Kim | ............... | H01L 21/823425 |
| | | | | 257/E21.627 |
| 7,740,459 B2* | 6/2010 | Fuertsch | ............... | F04B 43/043 |
| | | | | 417/413.3 |
| 8,164,190 B2* | 4/2012 | Filippi | ............... | H01L 23/5286 |
| | | | | 438/653 |
| 8,614,126 B1* | 12/2013 | Lee | ............... | H10B 41/20 |
| | | | | 438/257 |
| 8,703,604 B2* | 4/2014 | Ponoth | ............... | H01L 23/5226 |
| | | | | 257/E21.548 |
| 9,373,699 B2* | 6/2016 | Chu | ............... | H01L 21/02271 |
| 9,627,318 B2* | 4/2017 | Lin | ............... | H01L 23/485 |
| 9,911,645 B2* | 3/2018 | Chang | ............... | H01L 23/5226 |
| 10,141,260 B1* | 11/2018 | Chan | ............... | H01L 23/53295 |
| 10,163,651 B1* | 12/2018 | Chen | ............... | H10N 50/10 |
| 10,950,497 B2* | 3/2021 | Tsai | ............... | H01L 21/32133 |
| 2005/0118826 A1* | 6/2005 | Boyd | ............... | H01L 21/26533 |
| | | | | 257/E21.339 |
| 2009/0294925 A1* | 12/2009 | Lin | ............... | H01L 21/3105 |
| | | | | 257/E29.007 |
| 2015/0364420 A1 | 12/2015 | Lin et al. | | |
| 2016/0043300 A1* | 2/2016 | Kim | ............... | G11C 11/161 |
| | | | | 365/158 |
| 2018/0337090 A1* | 11/2018 | Shen | ............... | H01L 21/76811 |
| 2020/0168502 A1 | 5/2020 | Tsai | | |

* cited by examiner

CONDUCTIVE ELEMENT FOR SEMICONDUCTOR DEVICES

PRIORITY INFORMATION

This application is a continuation of U.S. application Ser. No. 17/201,637 filed Mar. 15, 2021, which is a continuation of U.S. application Ser. No. 16/371,780 filed Apr. 1, 2019, which issued as U.S. Pat. No. 10,950,497, and which claims priority to U.S. Provisional Patent 62/771,401 filed Nov. 26, 2018 and entitled "Rivet Metal Scheme," the disclosure of each of which is hereby incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as the widths of interconnect lines continuously shrink, a contact area between a via bottom barrier layer and a metal conductor becomes smaller and smaller, which leads to higher contact resistance between the via and the metal conductor. It is desirable to reduce this contact resistance, particularly as technology nodes shrink.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, the scaling down of integrated circuits has also increased the complexity of processing and manufacturing ICs and, for these advances to be realized, similar developments in IC processing and manufacturing are needed. For example, as the widths of interconnect lines continuously shrink, a contact area between a via bottom layer and a metal conductor becomes smaller and smaller, which leads to higher contact resistance between the via and the metal conductor. It is desirable to reduce this contact resistance, particularly as technology nodes shrink. According to principles described herein, the connection between two conductive features is improved by performing a lateral recess on an etch stop layer before depositing the material for one of the conductive features. This increases the contact area between the two conductive features and thus reduces contact resistance.

In one example, after a first conductive feature is formed within a first dielectric layer (e.g. an Interlayer Dielectric (ILD) layer), a selective etching process is performed to selectively etch back the first conductive feature. Then, an etch stop layer is formed on the first conductive feature and the first dielectric layer. A second dielectric layer is then formed on the etch stop layer. The second dielectric layer and the etch stop layer are then patterned to expose the first conductive feature. Then, a lateral etching process is performed to laterally etch the etch stop layer. After the lateral etching process, an overlying conductive feature is formed on the conductive feature. Because the etch stop layer was laterally etched during the lateral etching process, there is more contact area between the underlying conductive feature and the newly formed conductive feature. This reduces the contact resistance between the underlying conductive feature and the newly formed conductive feature.

The principles described herein provide other advantages as well. For example, the corner of the etch-stop layer protects the bridge between the underlying conductive feature and the overlying conductive feature. Furthermore, the sheet resistance may be reduced because part of the underlying conductive feature is replaced with the overlying conductive feature.

Figure 1A:
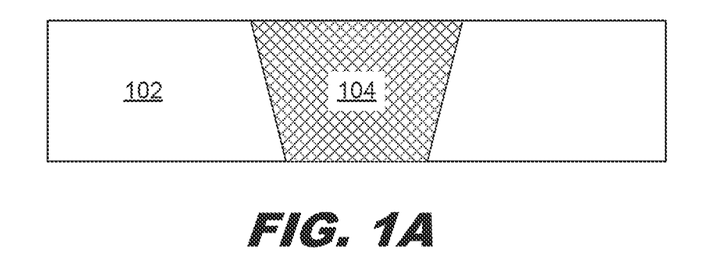
FIGS. 1A-1H are diagrams showing an illustrative process for forming an improved electrical connection between two conductive features, according to one example of principles described herein.

FIGS. 1A-1H are diagrams showing an illustrative process for forming an improved electrical connection between two conductive features. FIG. 1A illustrates a conductive feature 104 formed within a dielectric layer, such as an Interlayer Dielectric (ILD) layer. The dielectric layer 102 may be made of a nitride material such as silicon nitride. The dielectric layer 102 may be formed on a semiconductor substrate. The semiconductor substrate may be a silicon substrate. In some examples, however, the substrate may be a silicon germanium substrate. Other types of semiconductor substrates are contemplated.

In one example, the conductive feature 104 may be a via contact. A via contact is a conductive structure that allegedly connects the contact, such as a gate contact or source/drain contact to an overlying conductive feature, such as a metal interconnect. In some examples, the conductive feature 104 may be a via to an underlying metal interconnect layer. Other types of conductive structures are contemplated. The conductive feature may include a metal material such as copper, cobalt, nickel, tungsten, or ruthenium.

The conductive feature 104 may be formed in one of a variety of ways. In one example, photolithographic patterning process is applied to the dielectric layer 102. For example, a photoresist may be applied to the dielectric layer 102. Then, the photoresist may be exposed to a light source through a mask. After exposure, the photoresist may be developed in a developing solution. This will remove either the exposed or unexposed portions the photoresist. Then, an etching process may be applied to the underlying dielectric layer 102 through the exposed portions of the photoresist. The etching process forms a trench within the dielectric layer 102. This trench may then be filled with a conductive material such as a metal material to form the conductive feature 104.

Figure 1B:
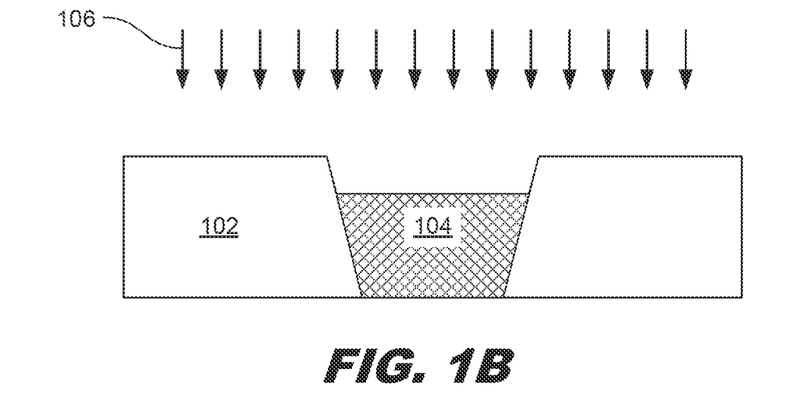

FIG. 1B illustrates an etching process 106 to selectively etch back the conductive feature 104. The etching process is selected because it is designed to remove primarily the conductive feature 104 without substantially affecting the dielectric layer 102. The etching process 106 may remove about 0.1 to 50 nm worth of material from the conductive feature 104. After the etching process 106, the top surface of the conductive feature 104 will be lower than the top surface of the dielectric layer 102. The etching process 106 may be one of a variety of etching processes in one example, the etching process 106 is a wet etching process. In one example, the etching process 106 is a dry etching process.

Figure 1C:
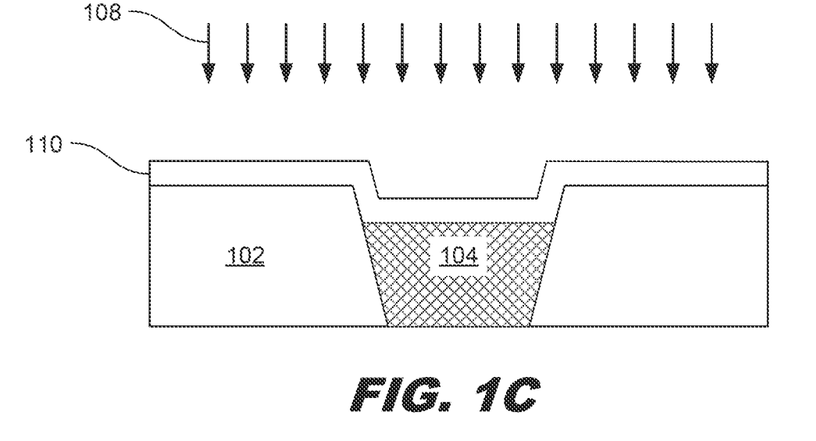

FIG. 1C illustrates a deposition process 108 to form a Content Etch-Stop Layer (CESL) 110. The CESL 110 may be used to provide better control of subsequently performed etching processes to avoid unnecessarily applying an etching process to the conductive feature 104 or the dielectric layer 102. The CESL 110 has a top surface in which portions over the conductive feature 104 are lower than portions over the dielectric layer 102.

The CESL 110 may be made of a variety of materials. In one example, the CESL may include a high-k material such as silicon oxynitride (SiON), tantalum oxide ($Ta_2O_5$), aluminum oxide (Al2O3), zirconium oxide (ZrO2), aluminum oxide layer, nitrogen oxide layer, nitride oxide, metal oxide dielectric, hafnium oxide, tantalum oxide, titanium oxide, and chromium oxide, aluminum oxide, lanthanum oxide, or other high-k material. The CESL may be a dielectric material that is different from that of the dielectric layer 102 or metal gate spacer layers used to form gate devices. The CESL may be made of multiple dielectric layers.

Figure 1D:
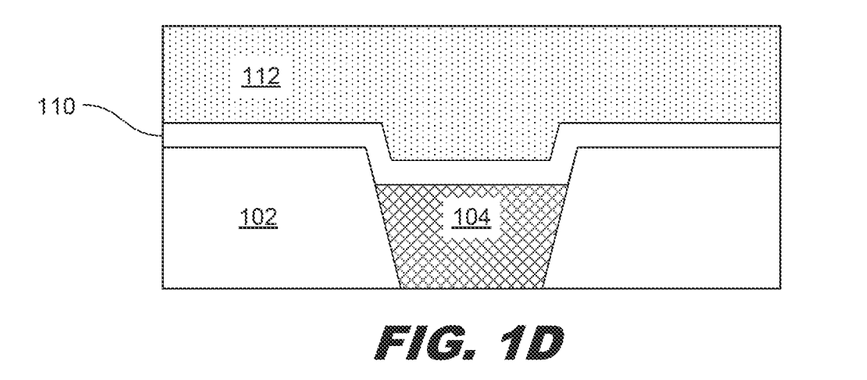

FIG. 1D illustrates a second dielectric layer 112 formed on the CESL 110. In some examples, the dielectric layer 112 may be made of the same materials as dielectric layer 102. In some examples, however, dielectric layer 112 may be different than dielectric layer 102. The dielectric layer may include a low-k dielectric material such as silicon oxide or silicon nitride.

Figure 1E:
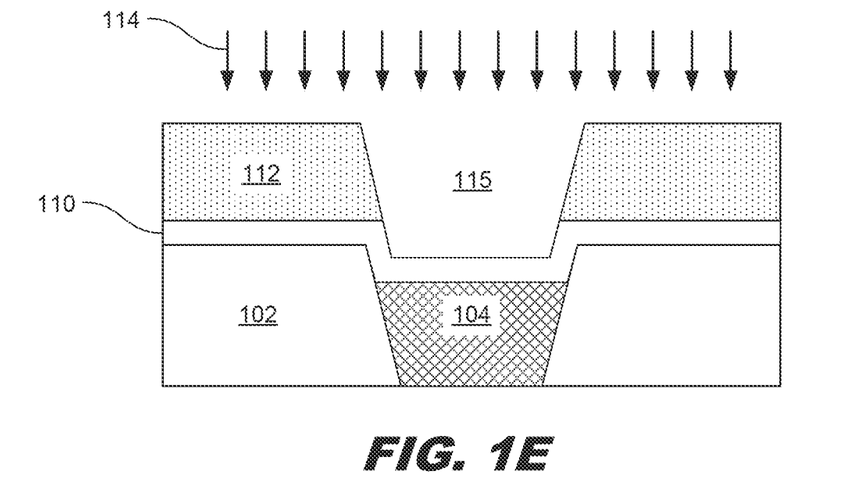

FIG. 1E illustrates an etching process 114 to form a trench 115 within the second dielectric layer 112. The etching process 114 may be a dry etching process. The etching process 114 may use fluorine-based etchants. The etching process 114 may be performed as part of a photolithographic patterning process. Thus, the etching process 114 is applied to only certain portions of the dielectric layer 112. The etching process proceeds until reaching the CESL 110. This is because the etching process 114 is selective and the materials of the CESL and dielectric layer 112 are selected so that the etching process 114 removes the dielectric layer without substantially affecting the CESL 110.

Figure 1F:
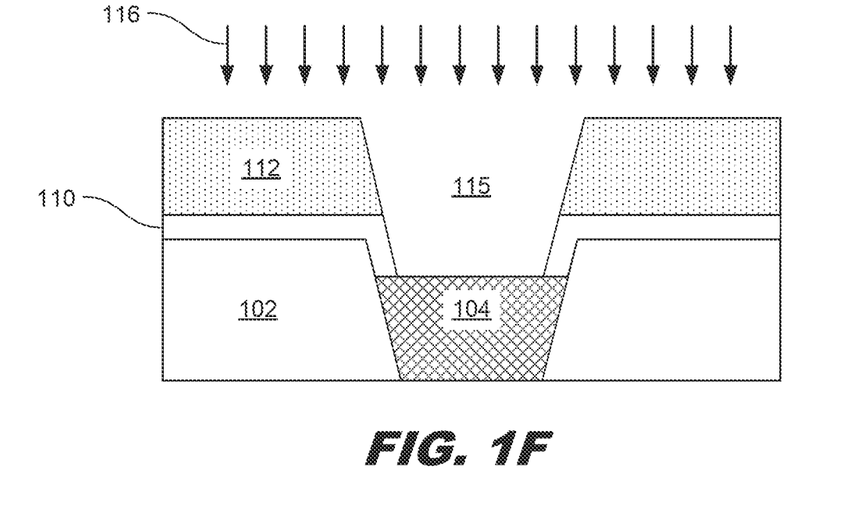

FIG. 1F illustrates another etching process 116 to remove the CESL layer. In one example, the etching process 116 is a dry etching process. Dry etching processes are anisotropic. In other words, they etch in a single direction. The etching process 116 may use chlorine-based etchants. The etching process 116 removes the CESL 110 to expose the top surface of the conductive feature 104. However, the entire top surface of the conductive feature 104 is not exposed at this time.

Figure 1G:
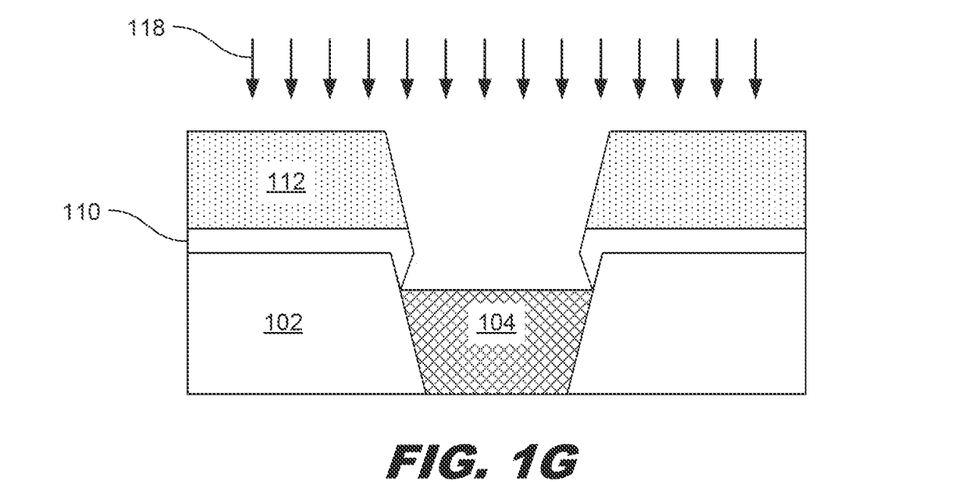

FIG. 1G illustrates another etching process 118 to laterally recess the CESL 110 to expose more of the top surface of the conductive feature. The lateral etching process may be an isotropic etching process such as a wet etching process. In some examples, the etching process 118 may use ammonia-based etchants, or standard cleaning solution SC1.

Figure 1H:
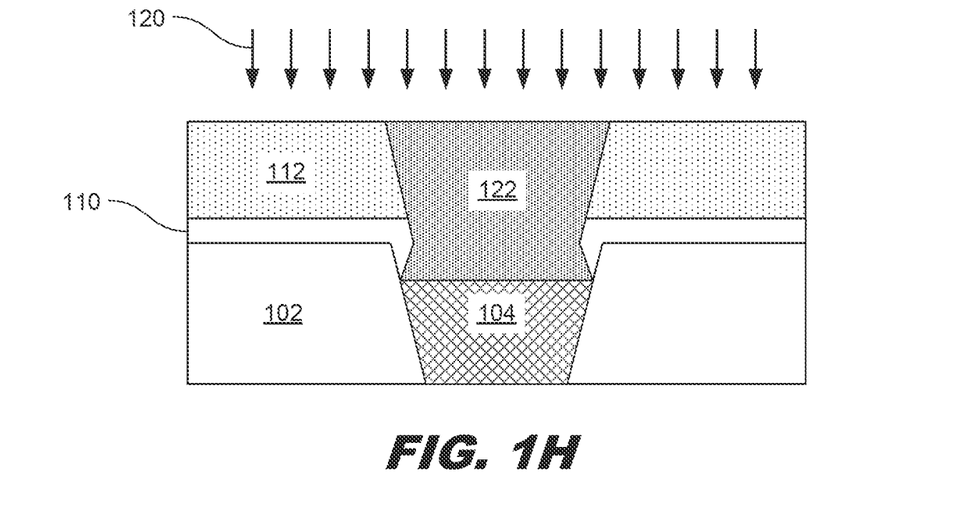

FIG. 1H illustrates a deposition process 120 to form a second conductive feature 122 within the trench 115. The conductive feature 122 may include a metal material such as copper, cobalt, nickel, tungsten, or ruthenium. Because the CESL 110 was laterally etched during etching process 118, there is more contact area between the underlying conductive feature 104 and the newly formed conductive feature 122. This reduces the contact resistance between the underlying conductive feature 104 and the newly formed conductive feature 122. In some examples, after the conductive feature 122 is formed, a Chemical-Mechanical Polishing (CMP) process may be performed to planarize the top surface of the conductive feature 122 and the dielectric layer 112.

Because the etch stop layer is laterally etched during the lateral etching process, there is more contact area between the underlying conductive feature and the newly formed conductive feature. This reduces the contact resistance between the underlying conductive feature and the newly formed conductive feature. Furthermore, the corner of the etch-stop layer protects the bridge between the underlying conductive feature and the overlying conductive feature. Furthermore, the sheet resistance may be reduced because part of the underlying conductive feature is replaced with the overlying conductive feature.

When using the process described herein, the CESL 110 has a tapered portion where it meets the conductive feature 122. Specifically, there is a tapered portion extending from a top surface of the dielectric layer 102 down towards the first conductive feature 104. In some examples, the point of the tapered portion may contact the conductive feature 104. In some examples, the point of the tapered portion may not extend to the conductive feature 104.

Figure 2A:
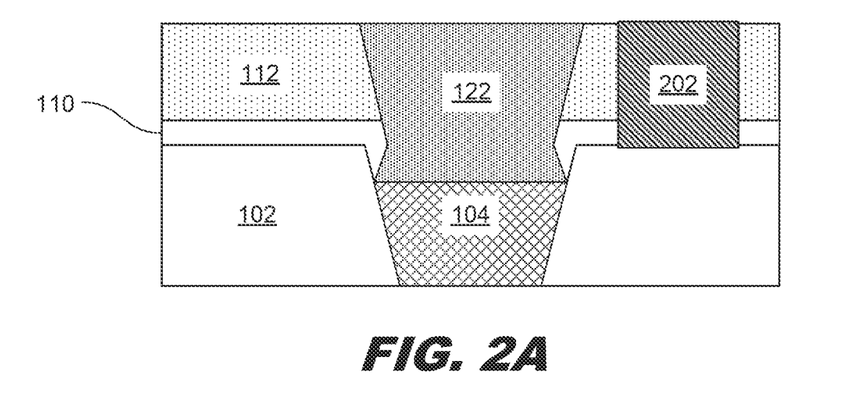
FIGS. 2A-2B are diagrams showing various underlying features, according to one example of principles described herein.
Figure 2B:
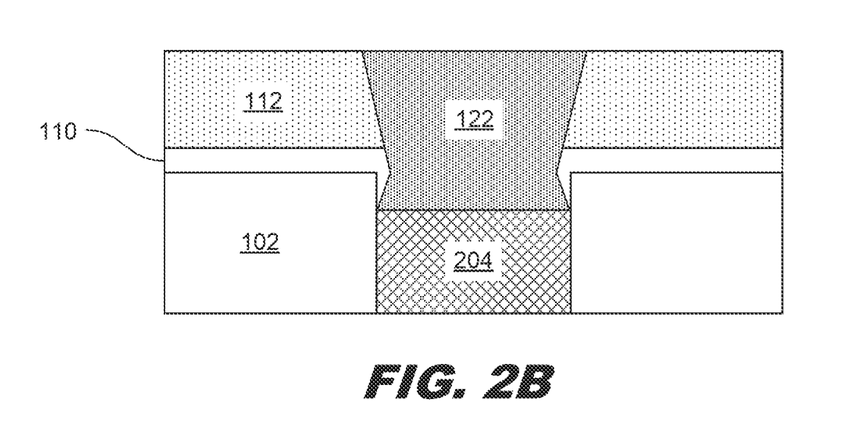

FIGS. 2A-2B are diagrams showing various underlying features. FIG. 2A illustrates an example in which the underlying conductive feature is a source/drain feature. In such case, the overlying conductive feature 122 may be a source/drain contact that is adjacent a gate device 202. The gate device 202 may have a top surface that is coplanar, or on the same level, as the top surface of the overlying conductive feature 122. In some examples, the source/drain feature may be an epitaxially grown source/drain feature. The source/drain features may include semiconductor materials such as silicon or silicon germanium. The source/drain features may be doped with n-type or p-type dopants.

In one example, after a source/drain feature is formed, a selective etching process is performed to selectively etch back the source/drain feature. Then, an etch stop layer is formed on the source/drain feature and the first dielectric layer. A second dielectric layer is then formed on the etch stop layer. The second dielectric layer and the etch stop layer are then patterned to expose the source/drain feature. Then, a lateral etching process is performed to laterally etch the etch stop layer. After the lateral etching process, an overlying conductive feature is formed on the source/drain feature. Because the etch stop layer was laterally etched during the lateral etching process, there is more contact area between the source/drain feature and the newly formed conductive feature. This reduces the contact resistance between the source/drain feature and the newly formed conductive feature.

FIG. 2B is a diagram showing an illustrative example in which the underlying conductive feature is a gate device 204. In such example, the gate device 204 is recessed as described above. Then, the CESL layer 110 is placed over the recessed gate device 204 and dielectric layer 102. By applying principles described herein to the case where the underlying conductive feature is a gate device allows better contact between the gate device 204 and the gate contact (e.g., 122).

In one example, after a gate feature is formed within a dielectric layer (e.g., ILD), a selective etching process is performed to selectively etch back the gate feature. Then, an etch stop layer is formed on the gate feature and the first dielectric layer. A second dielectric layer is then formed on the etch stop layer. The second dielectric layer and the etch stop layer are then patterned to expose the gate feature. Then, a lateral etching process is performed to laterally etch the etch stop layer. After the lateral etching process, an overlying conductive feature is formed on the gate feature. Because the etch stop layer was laterally etched during the lateral etching process, there is more contact area between the gate feature and the newly formed conductive feature. This reduces the contact resistance between the gate feature and the newly formed conductive feature.

Figure 3:
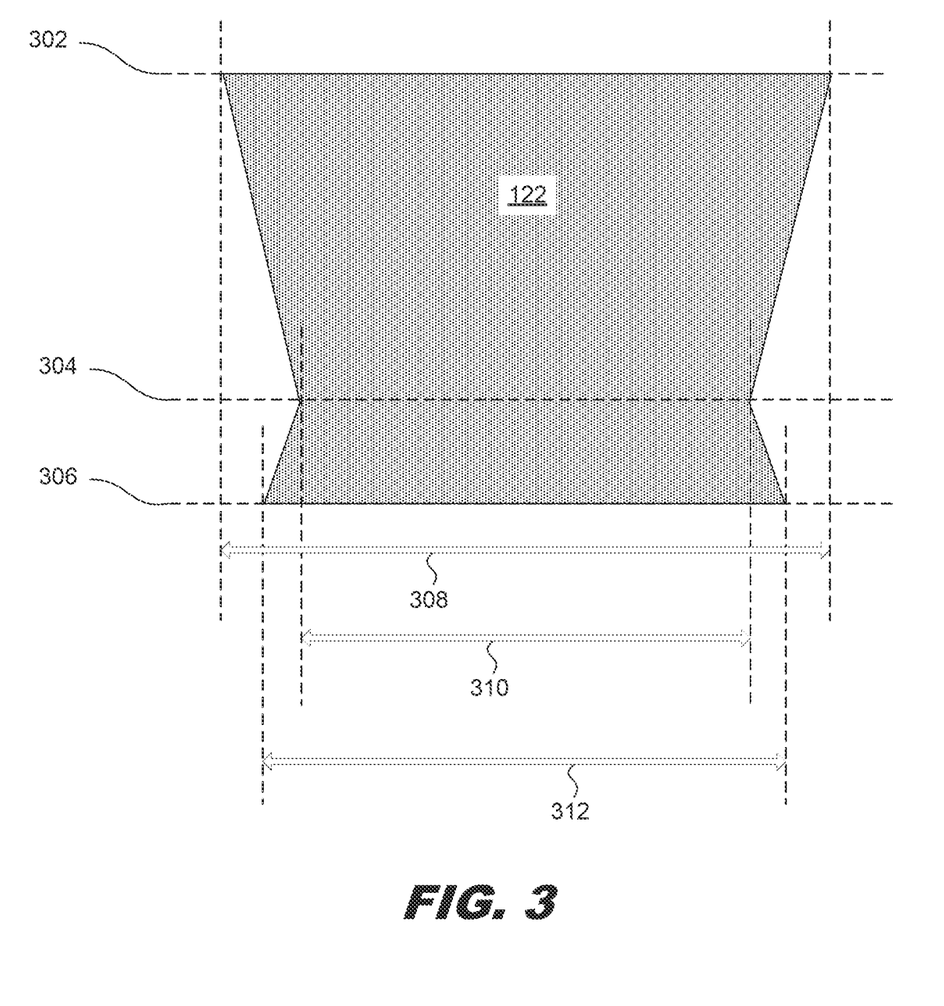
FIG. 3 is a diagram showing further detail of a conductive feature that is formed on an underlying feature, according to one example of principles described herein.

FIG. 3 is a diagram showing further detail of a conductive feature that is formed on an underlying feature 104. Particularly, FIG. 3 illustrates various dimensional relationships of the overlying conductive feature 122 that result from applying principles described herein. In the present example, the conductive feature 122 has an upper portion 302, a middle portion 304, and a lower portion 306. The lower portion 306 has a greater width 312 than the width 310 of the middle portion 304. Additionally, the width 308 of the upper portion 302 is greater than the width 310 of the middle portion and the width 312 of the lower portion 306.

Figure 4:
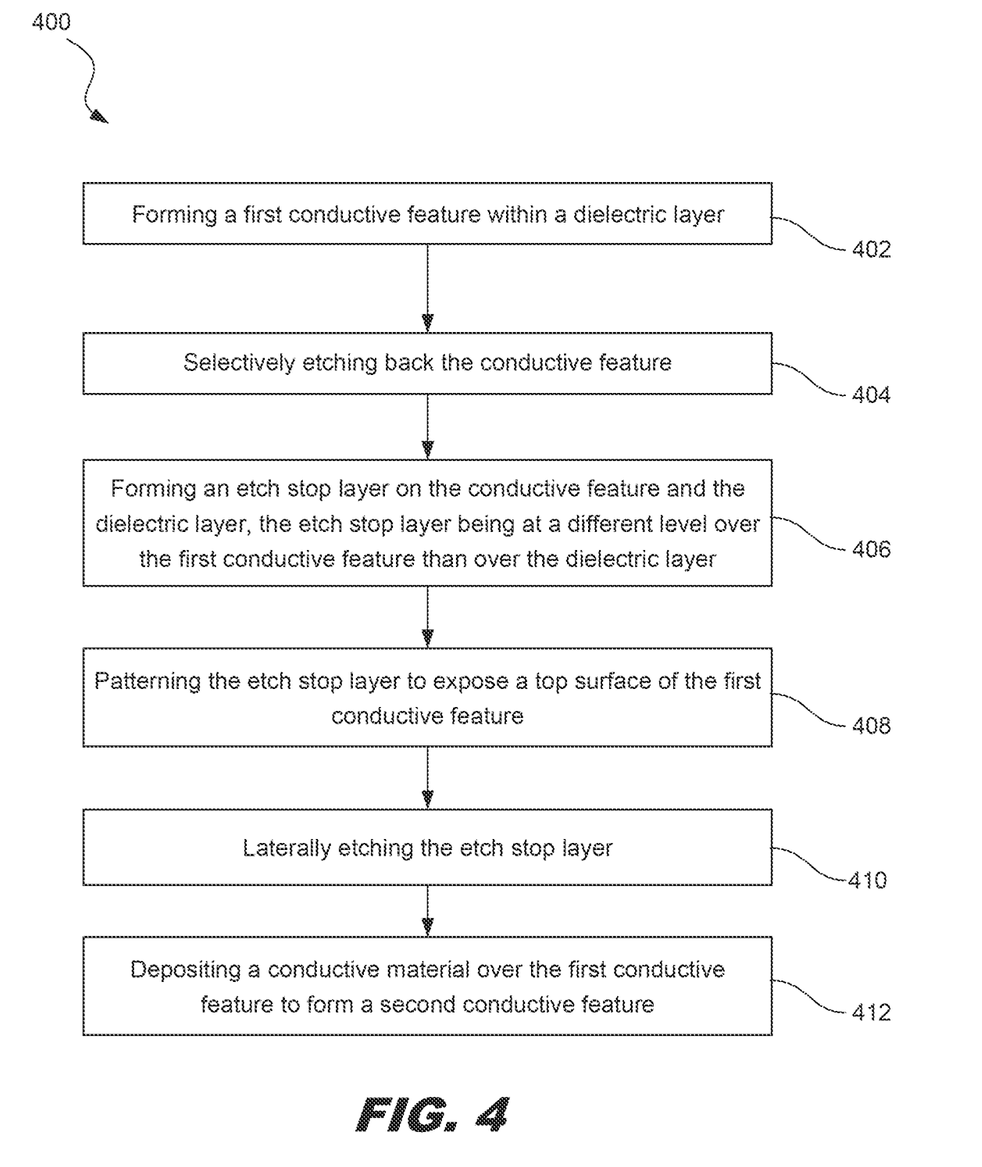
FIG. 4 is a flowchart showing an illustrative method for forming an improved electrical connection between two conductive features, according to one example of principles described herein.

FIG. 4 is a flowchart showing an illustrative method for forming an improved electrical connection between two conductive features. According to the present example, the method 400 includes a process 402 for forming a first conductive feature (e.g., 104) within a dielectric layer (e.g., 102). The dielectric layer may be made of a nitride material such as silicon nitride. The dielectric layer may be formed on a semiconductor substrate. The semiconductor substrate may be a silicon substrate. In some examples, however, the substrate may be a silicon germanium substrate. Other types of semiconductor substrates are contemplated.

In one example, the conductive feature may be a via contact. A via contact is a conductive structure that allegedly connects the contact, such as a gate contact or source/drain contact to an overlying conductive feature, such as a metal interconnect. In some examples, the conductive feature may be a via to an underlying metal interconnect layer. Other types of conductive structures are contemplated.

The conductive feature may be formed in one of a variety of ways. In one example, photolithographic patterning process is applied to the dielectric layer. For example, a photoresist may be applied to the dielectric layer. Then, the photoresist may be exposed to a light source through a mask. After exposure, the photoresist may be developed in a developing solution. This will remove either the exposed or unexposed portions the photoresist. Then, an etching process may be applied to the underlying dielectric layer through the exposed portions of the photoresist. The etching process forms a trench within the dielectric layer. This trench may then be filled with a conductive material such as a metal material to form the conductive feature.

The method 400 further includes a process 404 for selectively etching back the conductive feature. The etching process is selected because it is designed to remove primarily the conductive feature without substantially affecting the dielectric layer. The etching process may remove about 0.1 to 50 nm worth of material from the conductive feature. After the etching process, the top surface of the conductive feature will be lower than the top surface of the dielectric layer. The etching process may be one of a variety of etching processes in one example, the etching process 106 is a wet etching process. In one example, the etching process is a dry etching process.

The method 400 further includes a process 406 for forming an etch stop layer (e.g., CESL 110) on the conductive feature and the dielectric layer, the etch stop layer being at a different level over the first conductive feature than over the dielectric layer. The CESL may be used to provide better control of subsequently performed etching processes to avoid unnecessarily applying an etching process to the conductive feature or the dielectric layer. The CESL has a top surface in which portions over the conductive feature are lower than portions under the dielectric layer. The CESL 110 may be made of a variety of materials. In one example, the CESL may include a high-k material such as silicon oxynitride (SiON), tantalum oxide ($Ta_2O_5$), aluminum oxide (Al2O3), zirconium oxide (ZrO2), aluminum oxide layer, nitrogen oxide layer, nitride oxide, metal oxide dielectric, hafnium oxide, tantalum oxide, titanium oxide, and chromium oxide, aluminum oxide, lanthanum oxide, or other high-k material. The CESL may be a dielectric material that is different from that of the dielectric layer 102 or metal gate spacer layers used to form gate devices. The CESL may be made of multiple dielectric layers.

The method 400 further includes a process 408 for patterning the etch stop layer to expose a top surface of the first conductive feature. For example, this may be done by using an etching process (e.g., 116) to remove the CESL layer. In one example, the etching process is a dry etching process. Dry etching processes are anisotropic. In other words, they etch in a single direction. The etching process may use chlorine-based etchants. The etching process removes the CESL to expose the top surface of the conductive feature. However, the entire top surface of the conductive feature may not be exposed at this time.

The method 400 further includes a process 410 for laterally etching the etch stop layer. This may be done by using an etching process (e.g., 118) to laterally recess the CESL to expose more of the top surface of the conductive feature. The lateral etching process may be an isotropic etching process such as a wet etching process. In some examples, the etching process may use ammonia-based etchants, or standard cleaning solution SC1.

The method 400 further includes a process 412 for depositing a conductive material over the first conductive feature to form a second conductive feature. Because the CESL was laterally etched during the lateral etching process, there is more contact area between the underlying conductive feature and the newly formed conductive feature. This reduces the contact resistance between the underlying conductive feature and the newly formed conductive feature. In some examples, after the conductive feature is formed, a Chemical-Mechanical Polishing (CMP) process may be performed to planarize the top surface of the conductive feature and the dielectric layer.

Figure 5:
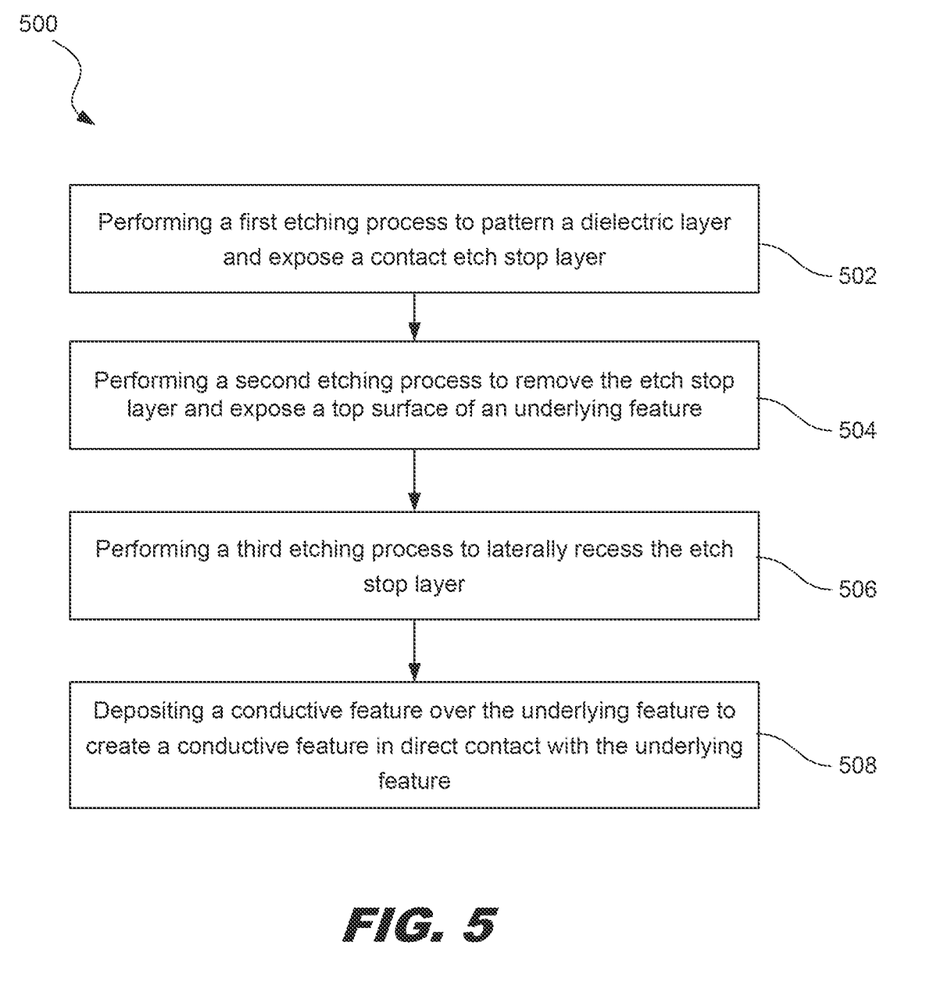
FIG. 5 is a flowchart showing an illustrative method for forming an improved electrical connection between two conductive features, according to one example of principles described herein.

FIG. 5 is a flowchart showing an illustrative method for forming an improved electrical connection between two conductive features. According to one example, the method 500 includes a process 502 for performing a first etching process (e.g., 114) to pattern a dielectric layer (e.g., 112) and expose a contact etch stop layer (e.g., 110). The etching process may form a trench (e.g., 115) within the second dielectric layer. The first etching process may be a dry etching process. The first etching process may use fluorine-based etchants. The first etching process may be performed as part of a photolithographic patterning process. Thus, the first etching process is applied to only certain portions of the dielectric layer. The etching process proceeds until reaching the CESL. This is because the first etching process is selective and the materials of the CESL and dielectric layer are selected so that the first etching process removes the dielectric layer without substantially affecting the CESL. The CESL 110 may be made of a variety of materials. In one example, the CESL may include a high-k material such as silicon oxynitride (SiON), tantalum oxide ($Ta_2O_5$), aluminum oxide (Al2O3), zirconium oxide (ZrO2), aluminum content oxide layer, nitrogen content oxide layer, nitride oxide, metal oxide dielectric, hafnium content oxide, tantalum content oxide, titanium content oxide, and chromium content oxide, aluminum content oxide, lanthanum content oxide, or other high-k material. The CESL may be a dielectric material that is different from that of the dielectric layer 102 or metal gate spacer layers used to form gate devices. The CESL may be made of multiple dielectric layers.

In some examples, the CESL is formed on another dielectric layer (e.g., 102). That dielectric layer may be, for example, an Interlayer Dielectric (ILD) layer. The dielectric layer may be made of a nitride material such as silicon nitride. The dielectric layer may be formed on a semiconductor substrate. The semiconductor substrate may be a silicon substrate. In some examples, however, the substrate may be a silicon germanium substrate. Other types of semiconductor substrates are contemplated.

In one example, the conductive feature may be a via contact. A via contact is a conductive structure that allegedly connects the contact, such as a gate contact or source/drain contact to an overlying conductive feature, such as a metal interconnect. In some examples, the conductive feature may be a via to an underlying metal interconnect layer. Other types of conductive structures are contemplated.

The conductive feature may be formed in one of a variety of ways. In one example, photolithographic patterning process is applied to the dielectric layer. For example, a photoresist may be applied to the dielectric layer. Then, the photoresist may be exposed to a light source through a mask. After exposure, the photoresist may be developed in a developing solution. This will remove either the exposed or unexposed portions the photoresist. Then, an etching process may be applied to the underlying dielectric layer 102 through the exposed portions of the photoresist. The etching process forms a trench within the dielectric layer. This trench may then be filled with a conductive material such as a metal material to form the conductive feature.

The method 500 further includes a process 504 for performing a second etching process (e.g., 116) to remove the etch stop layer and expose a top surface of an underlying feature. In one example, the second etching process is a dry etching process. Dry etching processes are anisotropic. In other words, they etch in a single direction. The second etching process may use chlorine-based etchants. The second etching process removes the CESL to expose the top surface of the conductive feature. However, the entire top surface of the conductive feature is not exposed at this time.

The method 500 further includes a process 506 for performing a third etching process to laterally recess the etch stop layer. This exposes more of the top surface of the conductive feature. The lateral etching process may be an isotropic etching process such as a wet etching process. In some examples, the third etching process may use ammonia-based etchants, or standard cleaning solution SC1.

The method 500 further includes a process 508 for depositing a conductive feature over the underlying feature to create a conductive feature in direct contact with the underlying feature. Because the CESL was laterally etched during the lateral etching process, there is more contact area between the underlying conductive feature and the newly formed conductive feature. This reduces the contact resistance between the underlying conductive feature and the newly formed conductive feature. In some examples, after the conductive feature is formed, a Chemical-Mechanical Polishing (CMP) process may be performed to planarize the top surface of the conductive feature and the dielectric layer.

By applying the principles described herein, improved methods and structures may be realized. For example, because the etch stop layer is laterally etched during the lateral etching process, there is more contact area between the underlying conductive feature and the newly formed conductive feature. This reduces the contact resistance between the underlying conductive feature and the newly formed conductive feature. Furthermore, the corner of the etch-stop layer protects the bridge between the underlying conductive feature and the overlying conductive feature. Furthermore, the sheet resistance may be reduced because part of the underlying conductive feature is replaced with the overlying conductive feature.

In one example, a method includes forming a first conductive feature within a dielectric layer, selectively etching back the conductive feature, and forming an etch stop layer on the conductive feature and the dielectric layer. The etch stop layer is at a different level over the first conductive feature than over the dielectric layer. The method further includes patterning the etch stop layer to expose a top surface of the first conductive feature, laterally etching the etch stop layer, and depositing a conductive material over the first conductive feature to form a second conductive feature.

In one example, a method includes performing a first etching process to pattern a dielectric layer and expose a contact etch stop layer, performing a second etching process to remove the etch stop layer and expose a top surface of an underlying feature, performing a third etching process to laterally recess the etch stop layer, and depositing a conductive material over the underlying feature to create a conductive feature in direct contact with the underlying feature.

In one example, a semiconductor device includes a first conductive feature embedded in a first dielectric layer such that a top surface of the first dielectric layer is higher than a top surface of first conductive feature, a contact etch stop layer (CESL) disposed on the first dielectric layer, and a second conductive feature embedded in a second dielectric layer. The second dielectric layer is disposed on the CESL and the second conductive feature extends through the CESL and is in direct contact with the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first conductive feature within a dielectric layer;
   selectively etching back the first conductive feature to expose a sidewall of the dielectric layer;
   forming an etch stop layer over the dielectric layer, wherein the etch stop layer interfaces the sidewall of the dielectric layer;
   patterning the etch stop layer to expose an upper surface of the first conductive feature;
   laterally etching the etch stop layer to decrease a thickness of the etch stop layer at a bottom region of the sidewall of the dielectric layer; and
   depositing a conductive material over the first conductive feature to form a second conductive feature.

2. The method of claim 1, wherein the second conductive feature interfaces an edge of the etch stop layer having the decreased thickness.

3. The method of claim 1, wherein the laterally etching the etch stop layer provides a first thickness of the etch stop layer at the bottom region of the sidewall and a second thickness of the etch stop layer at a top region of the sidewall, wherein the second thickness is greater than the first thickness.

4. The method of claim 1, wherein the laterally etching the etch stop layer exposes an upper surface of the first conductive feature.

5. The method of claim 4, wherein the exposed upper surface extends from the sidewall of the dielectric layer to an opposing sidewall of the dielectric layer.

6. The method of claim 1, wherein patterning the etch stop layer comprises a first etching process that uses a fluorine-based etchant to remove the etch stop layer.

7. The method of claim 6, wherein patterning the etch stop layer comprises a second etching process that uses a chlorine-based etchant to remove the etch stop layer.

8. The method of claim 1, wherein laterally etching the etch stop layer comprises a wet etching process.

9. The method of claim 1, wherein the forming the etch stop layer includes depositing a high-k dielectric material.

10. The method of claim 1, wherein the second conductive feature has a lower portion, a middle portion, and an upper portion, the middle portion being narrower than the lower portion, the upper portion being wider than both the middle portion and the lower portion.

11. A semiconductor device comprising:
    a first conductive feature embedded in a first dielectric layer such that an upper surface of the first dielectric layer is higher than an upper surface of first conductive feature;
    a contact etch stop layer (CESL) disposed on the first dielectric layer;
    a second conductive feature embedded in a second dielectric layer, the second dielectric layer disposed on the CESL, the second conductive feature extending through the CESL and being in direct contact with the first conductive feature, the second conductive feature including an upper portion having sidewalls tapering in a converging direction and a lower portion having sidewalls tapering in a diverging direction.

12. The semiconductor device of claim 11, wherein the upper portion is adjacent the second dielectric layer and the lower portion is adjacent the CESL.

13. The semiconductor device of claim 12, wherein the upper portion at a widest point in a cross-sectional view is wider than the lower portion at a widest point in the cross-sectional view.

14. The semiconductor device of claim 11, wherein an interface point between the sidewalls tapering in the converging direction and the sidewalls tapering in the diverging direction directly touches the CESL.

15. The semiconductor device of claim 11, wherein the upper portion is adjacent the second dielectric layer, the upper portion having a first width and the lower portion is adjacent the CESL, the lower portion having a second width, the second width less than the first width.

16. A semiconductor device, comprising:
    a first conductive feature embedded in an opening in a first dielectric layer, wherein a portion of a sidewall of the first dielectric layer extends above the first conductive feature;
    an etch stop layer disposed over the first dielectric layer and extending along a length of the portion of the sidewall, wherein the etch stop layer has a first thickness at a lower point of the portion of the sidewall and a second thickness at an upper point of the portion of the sidewall, the second thickness being greater than the first thickness; and
    a second conductive feature extending through the etch stop layer and being in direct contact with the first conductive feature.

17. The semiconductor device of claim 16, wherein the second conductive feature is formed interfacing the etch stop layer having the first thickness.

18. The semiconductor device of claim 16, wherein the second conductive feature is formed interfacing the etch stop layer having the second thickness.

19. The semiconductor device of claim 16, wherein the etch stop layer has a tapered outer surface from a point measuring the first thickness to a point measuring the second thickness.

20. The semiconductor device of claim 19, wherein the etch stop layer directly interfaces the first dielectric layer, the second conductive feature and the second conductive feature.

* * * * *